(12) United States Patent
Hsiao et al.

(10) Patent No.: US 12,512,799 B2
(45) Date of Patent: Dec. 30, 2025

(54) CLASS-D AMPLIFYING SYSTEM AND POWER CONVERTER CIRCUIT THEREOF

(71) Applicant: Richtek Technology Corporation, Zhubei (TW)

(72) Inventors: Ming-Jun Hsiao, Hsinchu (TW); Shao-Ming Sun, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 889 days.

(21) Appl. No.: 17/697,901

(22) Filed: Mar. 17, 2022

(65) Prior Publication Data

US 2022/0302887 A1    Sep. 22, 2022

Related U.S. Application Data

(60) Provisional application No. 63/163,106, filed on Mar. 19, 2021.

(30) Foreign Application Priority Data

Jun. 24, 2021   (TW) .................................. 110123214

(51) Int. Cl.
*H03F 3/217*         (2006.01)
*H02M 1/42*          (2007.01)

(52) U.S. Cl.
CPC ........ *H03F 3/2178* (2013.01); *H02M 1/4266* (2013.01); *H03F 2200/03* (2013.01); *H03F 2200/351* (2013.01)

(58) Field of Classification Search
CPC ............... H03F 3/2178; H03F 2200/03; H03F 2200/351; H03F 2200/171; H03F 3/2173; H02M 1/4266; H02M 1/44; H02M 3/1582
USPC .......................................................... 330/251
See application file for complete search history.

(56) References Cited

U.S. PATENT DOCUMENTS 11,469,723 B2    10/2022   Terwal et al.

FOREIGN PATENT DOCUMENTS

| CN | 104578772 | A |   | 4/2015 |             |
|----|-----------|---|---|--------|-------------|
| CN | 107360505 | A | * | 11/2017 | ......... H03F 3/45475 |

* cited by examiner

*Primary Examiner* — Andrea Lindgren Baltzell
*Assistant Examiner* — Jose E Pinero
(74) *Attorney, Agent, or Firm* — Tung & Associates

(57) ABSTRACT

A class-D amplifying system includes: a class-D amplifier circuit configured to convert an input signal to a switch control signal in pulse width modulation fashion, wherein the switch control signal controls switches to operate a first inductor and a second inductor, thus converting an input power to a positive output signal and a negative output signal which are complementary to each other, to thereby drive a load; and a power converter circuit, which generates a direct current (DC) power supply according to at least one of the positive output signal and the negative output signal, wherein the DC power supply supplies at least a portion of power to the class-D amplifier circuit.

22 Claims, 6 Drawing Sheets

CLASS-D AMPLIFYING SYSTEM AND POWER CONVERTER CIRCUIT THEREOF

CROSS REFERENCE

The present invention claims priority to U.S. 63/163,106 filed on Mar. 19, 2021 and claims priority to TW 110123214 filed on Jun. 24, 2021.

BACKGROUND OF THE INVENTION

Field of Invention

The present invention relates to a class-D amplifying system; particularly, it relates to such class-D amplifying system capable of providing power supply according to at least a common mode voltage. The present invention also relates to a power converter circuit of a class-D amplifying system, wherein such power converter circuit is capable of providing power supply according to at least a common mode voltage.

Description of Related Art

Please refer to FIG. 1, which shows a schematic diagram of a conventional class-D amplifying system. The conventional class-D amplifying system 100 includes: a class-D amplifier circuit 10 and a low drop-out power converter 30. The class-D amplifier circuit 10 includes: a signal processing circuit 11, a driving circuit 12 and a class-D power stage circuit 13. The signal processing circuit 11 converts an analog or digital input signal IN to a switch control signal SW in pulse width modulation fashion. The driving circuit 12 generates a driving signal DRV according to the switch control signal SW. The driving signal DRV operate the switches in the class-D power stage circuit 13, so as to generate a positive output signal VOP and a negative output signal VON, to thereby drive a load 20. The input signal IN is for example an audio signal, and the load 20 is for example a speaker.

The low drop-out power converter 30 converts a power supply PVDD to a power supply AVDD, wherein the power supply AVDD supplies power to the signal processing circuit 11 and/or the driving circuit 12.

The prior art shown in FIG. 1 has the following drawback that: when there is a large difference between the power supply AVDD and the power supply PVDD, the low drop-out power converter 30 will cause a high power consumption.

Please refer to FIG. 2, which shows a schematic diagram of another conventional class-D amplifying system. The conventional class-D amplifying system 200 includes a switching regulator 40, to convert the power supply PVDD to the power supply AVPP by buck switching conversion, and next a low drop-out power converter 30 converts the power supply AVPP to the power supply AVDD, to supply power to the signal processing circuit 11 and/or a driving circuit 12. This arrangement improves the power conversion efficiency.

However, the prior art shown in FIG. 2 has the following drawback that: the switching regulator 40 requires extra power devices such as the inductor L3 and the switches for switching the inductor L3; this increases the manufacturing cost and the size of the overall circuitry.

In view of the above, to overcome the drawbacks in the prior art, the present invention proposes an innovated class-D amplifying system capable of enhancing power conversion efficiency while keeping low manufacturing cost and small circuitry size.

SUMMARY OF THE INVENTION

From one perspective, the present invention provides a class-D amplifying system, comprising: a class-D amplifier circuit, which is configured to operably convert an input signal to a switch control signal in pulse width modulation fashion, wherein the switch control signal is configured to operably control a plurality of switches, so as to operate a first inductor and a second inductor to convert an input power to respectively generate a positive output signal and a negative output signal which are complementary to each other, to thereby drive a load; and a power converter circuit, which is configured to operably generate a direct current (DC) power supply according to at least one of the positive output signal and the negative output signal, wherein the DC power supply supplies at least a portion of power to the class-D amplifier circuit.

In one embodiment, the power converter circuit includes: an input selection circuit, which is configured to operably select one of the positive output signal and the negative output signal as an intermediate power supply according to a level of the positive output signal and a level of the negative output signal, wherein the power converter circuit is configured to operably generate the DC power supply according to the intermediate power supply.

In one embodiment, the input selection circuit is configured to operably select one of the positive output signal and the negative output signal which has a higher voltage level as the intermediate power supply.

In one embodiment, the input selection circuit includes: a first diode and a second diode, which are coupled back-to-back in series between the positive output signal and the negative output signal, wherein a current outflow end of the first diode and a current outflow end of the second diode are both coupled to the intermediate power supply, so that the first diode and the second diode are configured to operably conduct one of the positive output signal and the negative output signal which has a higher voltage level to the intermediate power supply.

In one embodiment, the input selection circuit includes: a first switch and a second switch, which are coupled in series between the positive output signal and the negative output signal; and a comparison control circuit, which is configured to operably compare the positive output signal with the negative output signal, so as to generate a selection signal for controlling the first switch and the second switch, to conduct one of the positive output signal and the negative output signal which has a higher voltage level to the intermediate power supply.

In one embodiment, the power converter circuit further includes: a first low drop-out linear regulator (LDO), which is configured to operably generate the DC power supply according to the intermediate power supply.

In one embodiment, the power converter circuit further includes: a second low drop-out linear regulator (LDO), which is configured to operably generate the DC power supply according to the input power in a case when a voltage level of the intermediate power supply is lower than a threshold.

In one embodiment, the first inductor and a portion of the plurality of switches constitute a positive sub-power stage, whereas, the second inductor and another portion of the plurality of switches constitute a negative sub-power stage, wherein both the positive sub-power stage and the negative sub-power stage are buck power stage circuits, boost power stage circuits or buck-boost power stage circuits.

In one embodiment, in a case when the input signal is zero level, the voltage level of the intermediate power supply is a common mode level of the positive output signal and the negative output signal.

In one embodiment, the voltage level of the intermediate power supply is a sum of ½ of the amplitude of a difference mode voltage plus a common mode voltage, wherein the difference mode voltage is a difference between the positive output signal and the negative output signal, and the common mode voltage is a common mode level of the positive output signal and the negative output signal.

In one embodiment, the common mode voltage is ½ of the voltage of the input power.

From another perspective, the present invention provides a power converter circuit, which is configured to operably supply power to a class-D amplifier circuit, wherein the class-D amplifier circuit is configured to operably convert an input signal to a switch control signal in pulse width modulation fashion, wherein the switch control signal is configured to operably control a plurality of switches, so as to operate a first inductor and a second inductor to convert an input power to respectively generate a positive output signal and a negative output signal which are complementary to each other, to thereby drive a load; the power converter circuit comprising: an input selection circuit, which is configured to operably select one of the positive output signal and the negative output signal as an intermediate power supply according to a level of the positive output signal and a level of the negative output signal; and a first low drop-out linear regulator (LDO), which is configured to operably generate the DC power supply according to the intermediate power supply, wherein the DC power supply supplies at least a portion of power to the class-D amplifier circuit.

In one embodiment, the power converter circuit further includes: a second low drop-out linear regulator (LDO), which is configured to operably generate the DC power supply according to the input power in a case when a voltage level of the intermediate power supply is lower than a threshold.

The present invention has advantages that: the present invention can improve light-load efficiency and reduce power consumption without adopting extra external devices.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
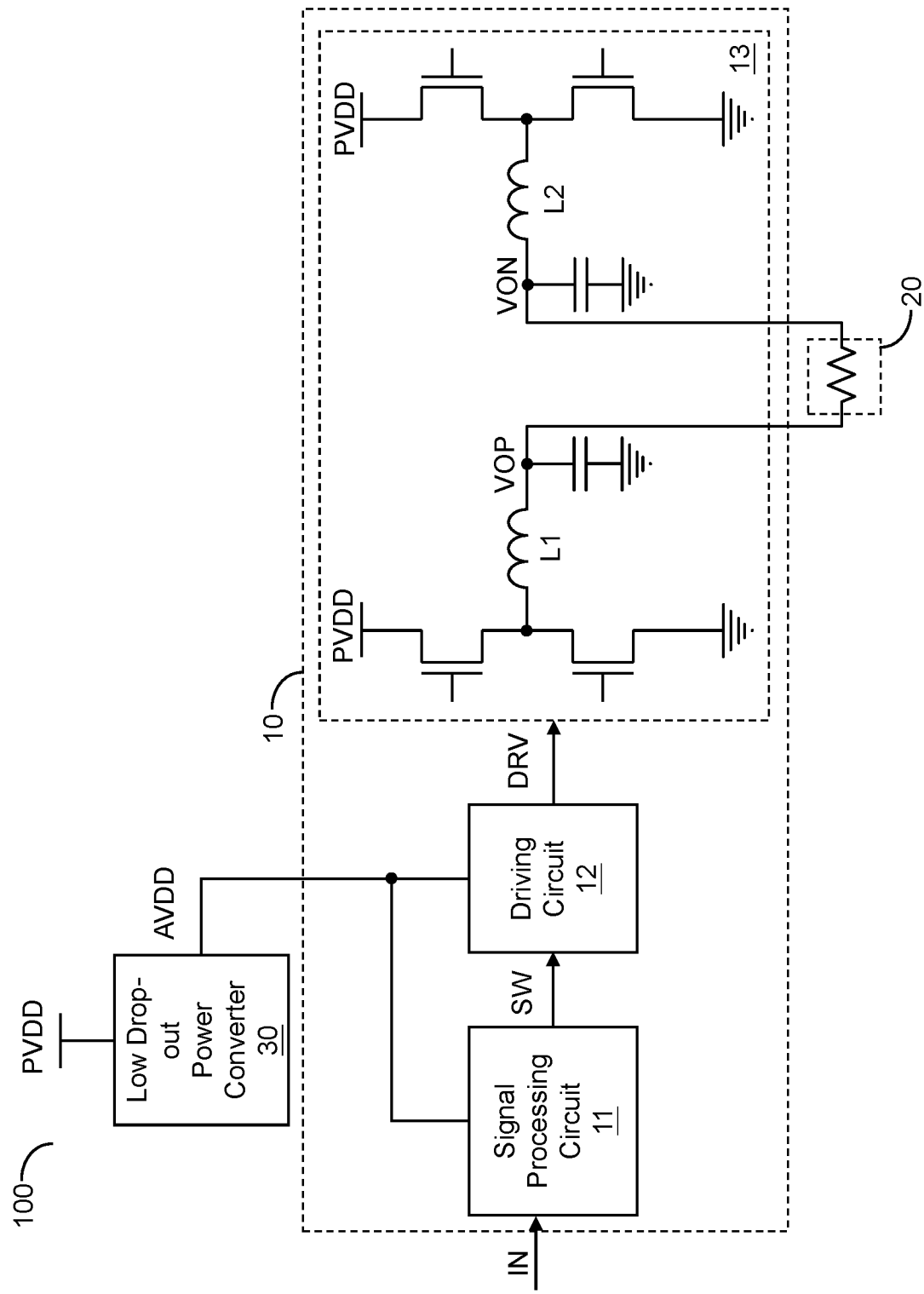
FIG. 1 shows a schematic diagram of a conventional class-D amplifying system.
Figure 2:
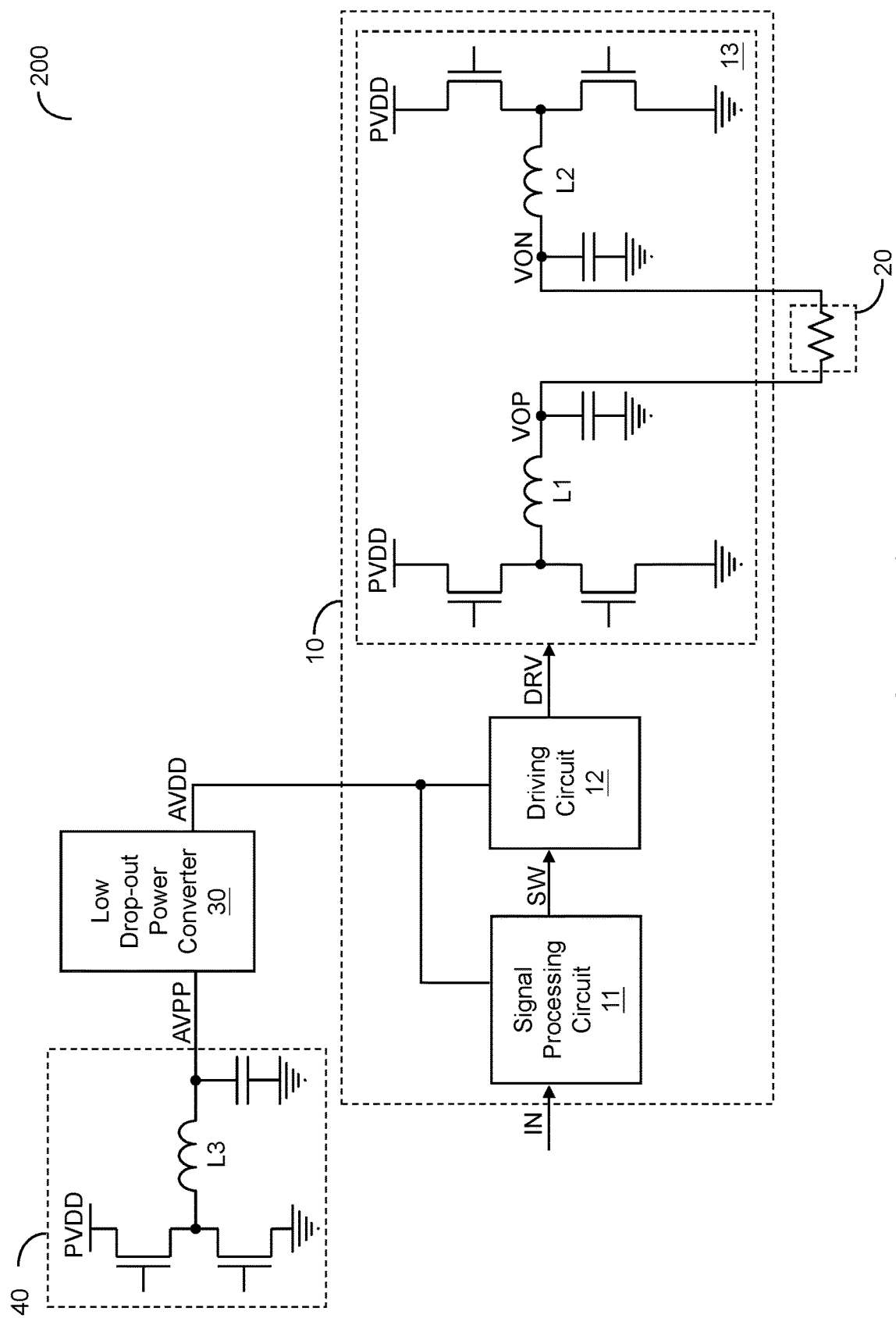
FIG. 2 shows a schematic diagram of another conventional class-D amplifying system.
Figure 3:
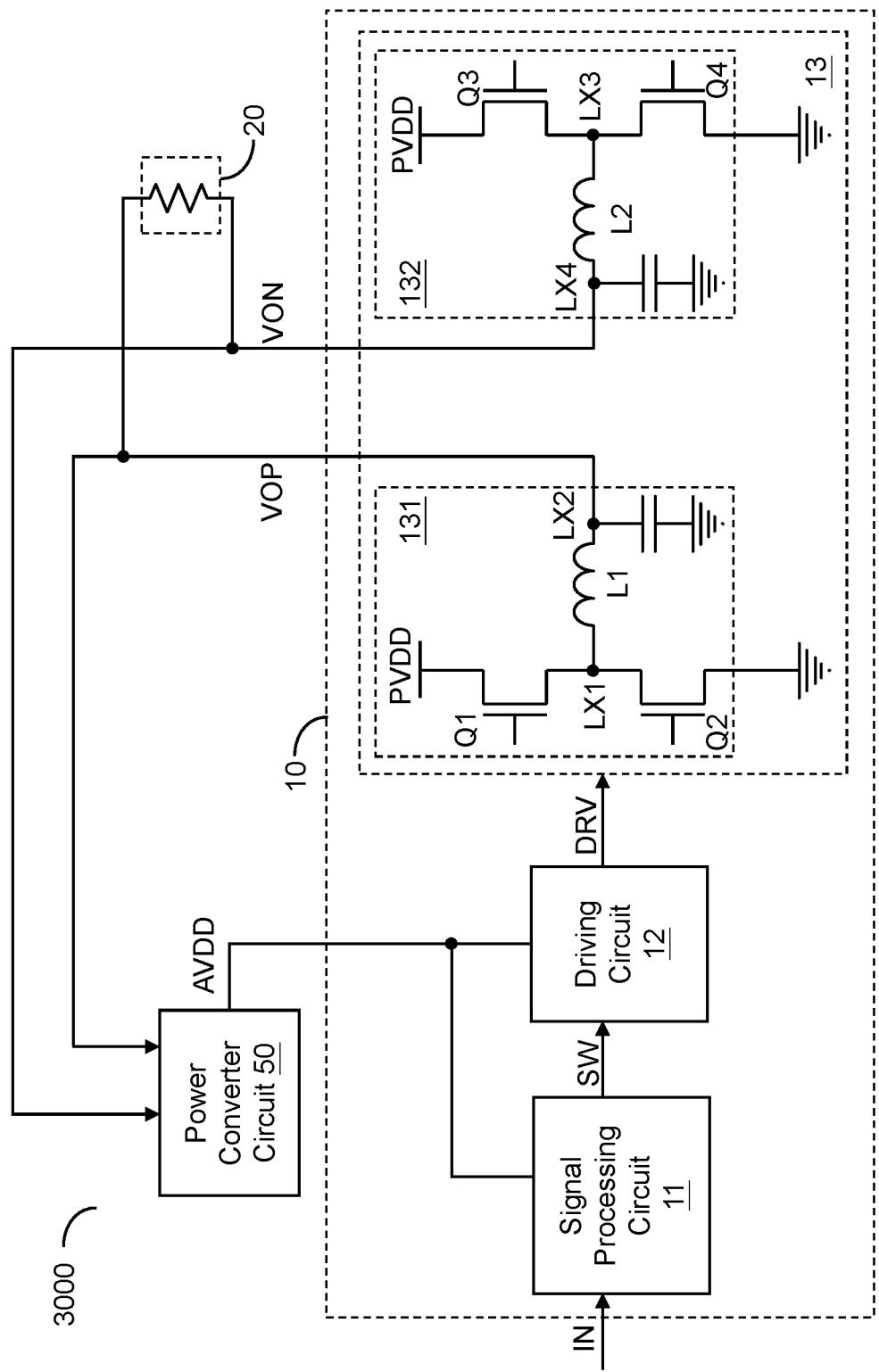
FIG. 3 shows a schematic circuit diagram of a class-D amplifying system according to an embodiment of the present invention.

Please refer to FIG. 3, which shows a schematic circuit diagram of a class-D amplifying system according to an embodiment of the present invention. As shown in FIG. 3, in this embodiment, the class-D amplifying system 3000 of the present invention includes: a class-D amplifier circuit 10 and a power converter circuit 50. The class-D amplifier circuit 10 is configured to operably convert an input signal IN to a switch control signal SW in pulse width modulation fashion, wherein the switch control signal SW is configured to operably control switches Q1~Q4, so as to operate a first inductor L1 and a second inductor L2 to convert an input power PVDD to a positive output signal VOP and a negative output signal VON which are complementary to each other, to thereby drive a load 20.

Please refer to FIG. 3. To elaborate in more detail, in one embodiment, the class-D amplifier circuit 10 includes: a signal processing circuit 11, a driving circuit 12 and a class-D power stage circuit 13. The signal processing circuit 11 converts the input signal IN which is an analog or digital signal to a switch control signal SW in pulse width modulation fashion. The driving circuit 12 generates a driving signal DRV according to the switch control signal SW. The driving signal DRV control the switches Q1~Q4 in the class-D power stage circuit 13, so as to operate a first inductor L1 and a second inductor L2 to convert the input power PVDD to the positive output signal VOP and the negative output signal VON which are complementary to each other, to thereby drive the load 20

As shown in FIG. 3, the switch Q1 is coupled between the input power PVDD and a first end LX1 of the first inductor L1, whereas, the switch Q2 is coupled between ground and the first end LX1 of the first inductor L1. The driving signal DRV controls the switches Q1 and Q2, so as to switch the first end LX1 of the first inductor L1 between the input power PVDD and the ground. The switch Q3 is coupled between the input power PVDD and a first end LX3 of the second inductor L2, whereas, the switch Q4 is coupled between ground and the first end LX3 of the second inductor L2. The driving signal DRV control the switches Q3 and Q4, so as to switch the first end LX3 of the second inductor L2 between the input power PVDD and the ground. The positive output signal VOP at a second end LX2 of the first inductor L1 is correlated with a voltage at the first end LX1 of the first inductor L1. The negative output signal VON at a second end LX4 of the second inductor L2 is correlated with a voltage at the first end LX3 of the second inductor L2. In one embodiment, the waveform of the positive output signal VOP and the waveform of the negative output signal VON are complementary to each other, for driving the load 20.

Figures 8A, 8B, 8C:
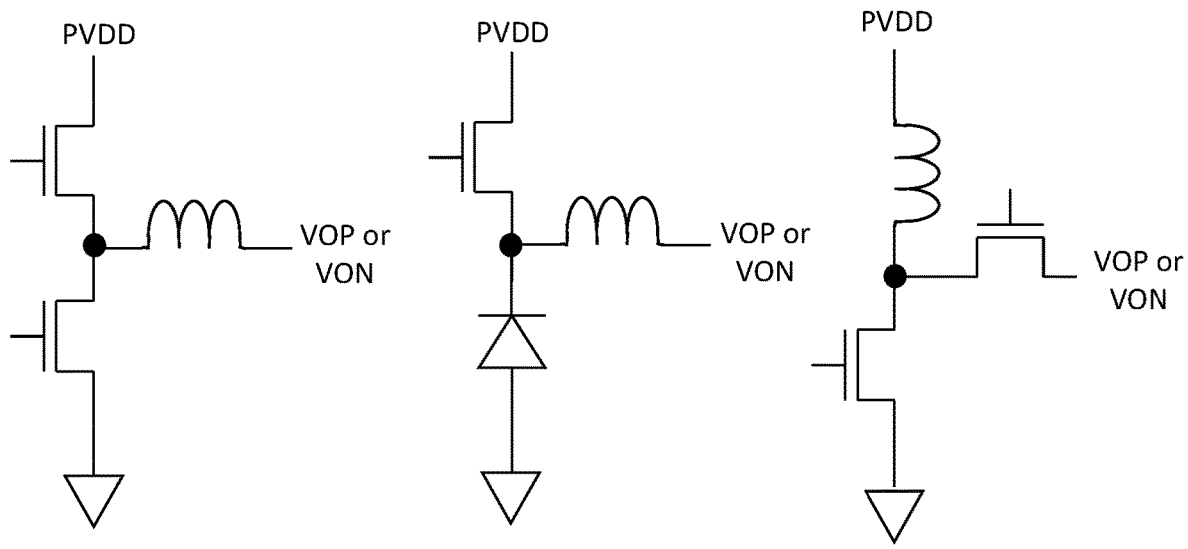
FIGS. 8A-8H show synchronous and asynchronous buck, boost and buck-boost converters, respectively.
Figure 8D:
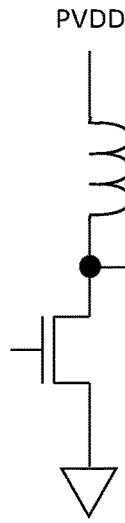
Figure 8E:
Figure 8F:
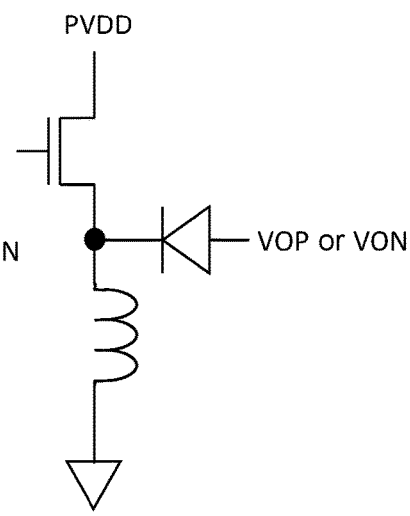
Figure 8G:
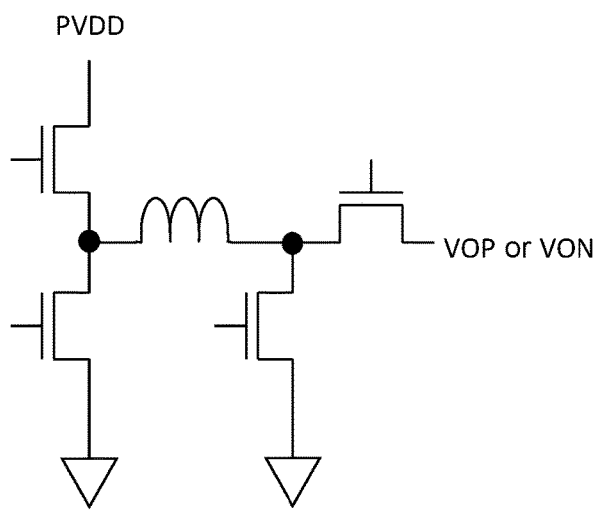
Figure 8H:
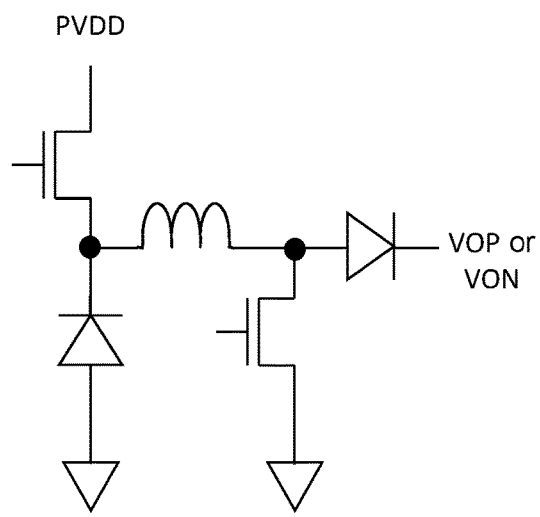

Please still refer to FIG. 3. The first inductor L1 and the switches Q1 and Q2 constitute a positive sub-power stage 131, whereas, the second inductor L2 and the switches Q3 and Q4 constitute a negative sub-power stage 132. Please refer to FIGS. 8A-8H, which show synchronous and asynchronous buck, boost and buck-boost converters, respectively. Please refer to FIG. 3 in conjugation with FIGS. 8A-8B; in one embodiment, the positive sub-power stage 131 and the negative sub-power stage 132 are both buck power stage circuits. Please refer to FIGS. 8C-8D; in another embodiment, the positive sub-power stage 131 and the negative sub-power stage 132 are both boost power stage circuits. Please refer to FIGS. 8E-8H; in yet another embodiment, the positive sub-power stage 131 and the negative sub-power stage 132 are both buck-boost power stage circuits. The input signal IN can be for example an audio signal. The load 20 can be for example a speaker. In one embodiment, a base frequency component of a difference between the positive output signal VOP and the negative output signal VON corresponds to the input signal IN. In one embodiment, the duty ratio of the switch control signal SW is correlated with the level of the input signal IN.

As shown in FIG. 3, in this embodiment, the power converter circuit 50 is coupled to the second end LX2 of the first inductor L1 and the second end LX4 of the second inductor L2. The power converter circuit 50 is configured to operably receive and convert at least one of the positive output signal VOP and the negative output signal VON, so as to generate the direct current (DC) power supply AVDD for supplying at least a portion of power to the class-D amplifier circuit 10. In one embodiment, the power converter circuit 50 is configured to operably convert one of (1)-(3): (1) the positive output signal VOP; (2) the negative output signal VON; or (3) the positive output signal VOP and the negative output signal VON, to generate the DC power supply AVDD. As shown in FIG. 3, the DC power supply AVDD functions as a power supply of for example the signal processing circuit 11 and/or the driving circuit 12. In one embodiment, the DC power supply AVDD functions as a power supply of the driving circuit 12.

Figure 4:
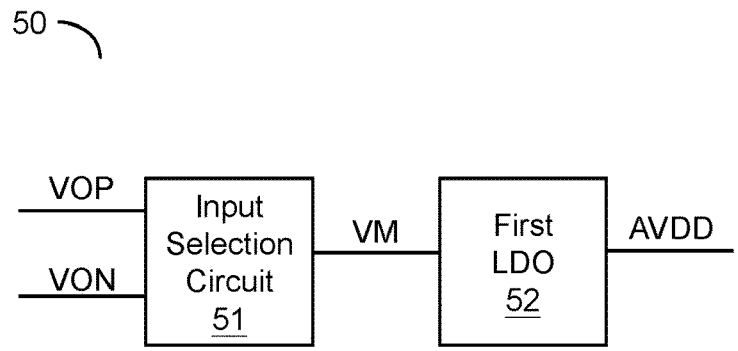
FIG. 4 shows a schematic circuit diagram of a power converter circuit of a class-D amplifying system according to an embodiment of the present invention.

Please refer to FIG. 4, which shows a schematic circuit diagram of a power converter circuit 50 of a class-D amplifying system according to an embodiment of the present invention. As shown in FIG. 4, in this embodiment, the power converter circuit 50 includes: an input selection circuit 51 and a first low drop-out linear regulator (LDO) 52. The input selection circuit 51 is configured to operably select one of the positive output signal VOP and the negative output signal VON as an intermediate power supply VM. In one embodiment, the input selection circuit 51 is configured to operably select one of the positive output signal VOP and the negative output signal VON which has a higher voltage level as the intermediate power supply VM. In one embodiment, preferably, the voltage level of the selected one of the positive output signal VOP and the negative output signal VON which has the higher voltage level is greater than or equal to ½ of the voltage level of the input power PVDD. The first low drop-out linear regulator (LDO) 52 is configured to operably generate the DC power supply AVDD according to the intermediate power supply VM. In one embodiment, the first low drop-out linear regulator (LDO) 52 converts the intermediate power supply VM to the DC power supply AVDD by linear conversion.

In one embodiment, in a case when the input signal IN is at zero level, the voltage level of the intermediate power supply VM is the common mode level of the positive output signal VOP and the negative output signal VON. In one embodiment, the voltage level of the intermediate power supply VM is a sum of ½ of the amplitude of the difference mode voltage plus the common mode voltage, wherein the difference mode voltage is a difference between the positive output signal VOP and the negative output signal VON, and the common mode voltage is the common mode level of the positive output signal VOP and the negative output signal VON. The amplitude of the difference mode voltage is ½ of the peak-to-peak value of the difference mode voltage. In other words, ½ of the amplitude of the difference mode voltage corresponds to ¼ of the peak-to-peak value of the difference mode voltage. The "common mode level" refers to the average level of the positive output signal VOP and the negative output signal VON. In one embodiment, the common mode voltage is ½ of the voltage of the input power PVDD.

Figure 5:
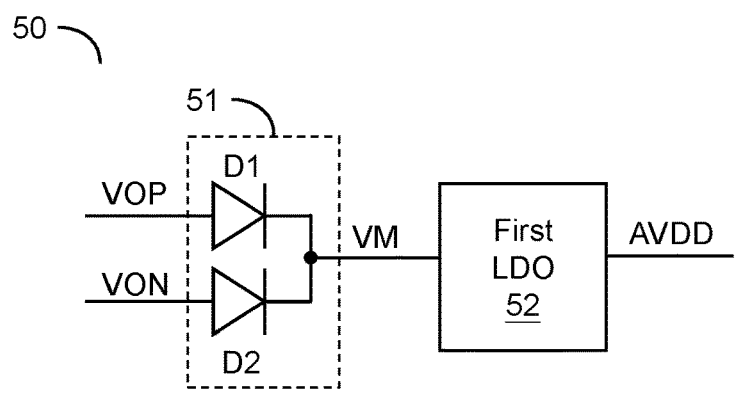
FIG. 5 shows a schematic circuit diagram of a power converter circuit of a class-D amplifying system according to another embodiment of the present invention.

Please refer to FIG. 5, which shows a schematic circuit diagram of a power converter circuit 50 of a class-D amplifying system according to another embodiment of the present invention. As shown in FIG. 5, in this embodiment, the input selection circuit 51 includes: a first diode D1 and a second diode D2. The first diode D1 and the second diode D2 are coupled back-to-back in series between the positive output signal VOP and the negative output signal VON. Besides, a current outflow end of the first diode D1 and a current outflow end of the second diode D2 are both coupled to the intermediate power supply VM. By this structure, the first diode D1 and the second diode D2 can conduct one of the positive output signal VOP and the negative output signal VON which has a higher voltage level to the intermediate power supply VM.

Figure 6:
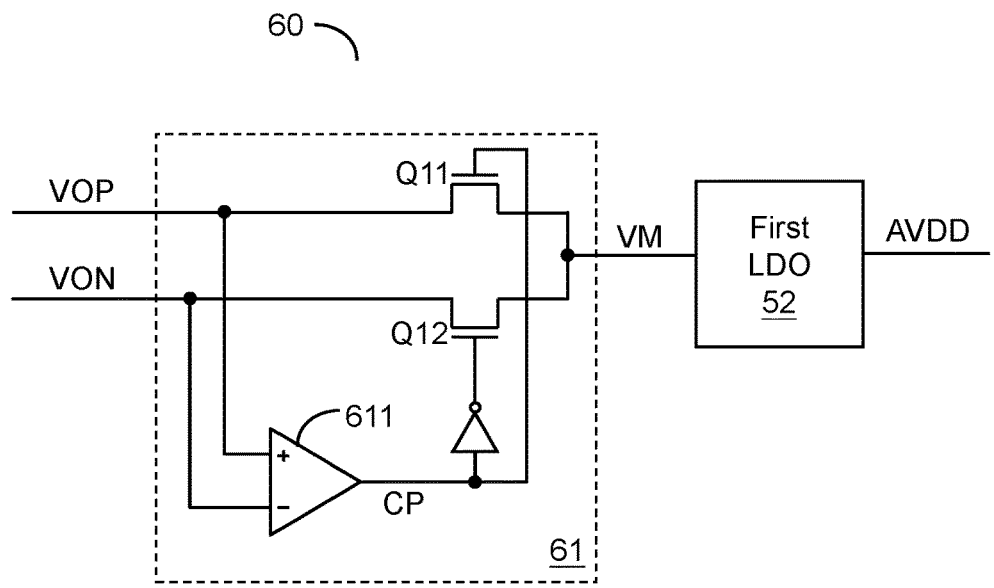
FIG. 6 shows a schematic circuit diagram of a power converter circuit of a class-D amplifying system according to yet another embodiment of the present invention.

Please refer to FIG. 6, which shows a schematic circuit diagram of a power converter circuit 60 of a class-D amplifying system according to yet another embodiment of the present invention. This embodiment shown in FIG. 6 is different from the embodiment shown in FIG. 5 in that: the input selection circuit 61 of this embodiment includes a first switch Q11, a second switch Q12 and a comparison control circuit 611. The first switch Q11 and the second switch Q12 are coupled in series between the positive output signal VOP and the negative output signal VON. The comparison control circuit 611 is configured to operably compare the positive output signal VOP with the negative output signal VON, so as to generate a selection signal CP for controlling the first switch Q11 and the second switch Q12, to conduct one of the positive output signal VOP and the negative output signal VON which has a higher voltage level to the intermediate power supply VM. It should be understood that the implementation of the input selection circuit as the diodes in the above-mentioned preferred embodiment shown in FIG. 5 and the implementation of the input selection circuit as the switches in the above-mentioned preferred embodiment shown in FIG. 6 are only illustrative examples, but not for limiting the broadest scope of the present invention. In other embodiments, it is also practicable and within the scope of the present invention that the input selection circuit can be implemented via any other feasible approach.

Figure 7:
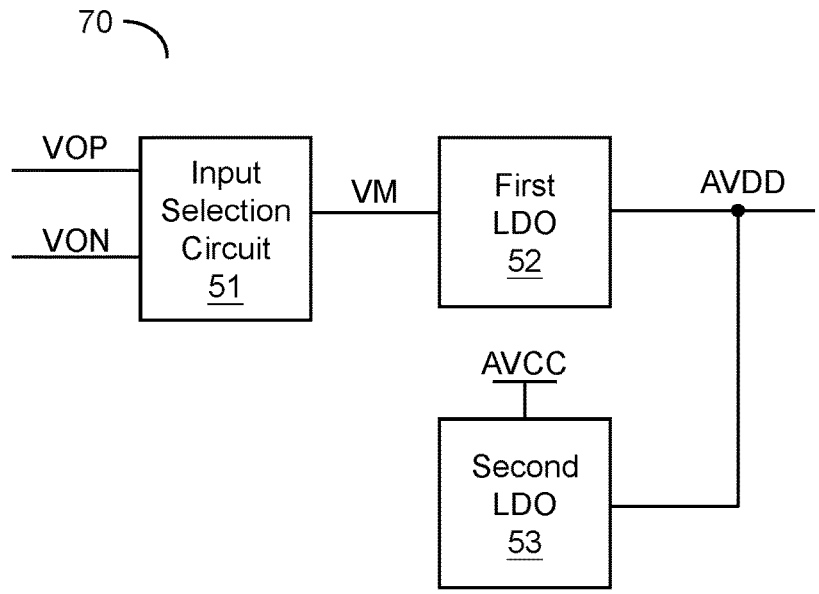
FIG. 7 shows a schematic circuit diagram of a power converter circuit of a class-D amplifying system according to still another embodiment of the present invention.

Please refer to FIG. 7, which shows a schematic circuit diagram of a power converter circuit 70 of a class-D amplifying system according to still another embodiment of the present invention. This embodiment shown in FIG. 7 is different from the embodiment shown in FIG. 4 in that: the power converter circuit 70 of this embodiment further includes a second low drop-out linear regulator (LDO) 53, which is configured to operably generate a DC power supply AVDD according to an input power AVCC in a case when the voltage level of the intermediate power supply VM is lower than a threshold. To be more specific, the second low drop-out linear regulator (LDO) 53 for example can be used to provide the DC power supply AVDD during a start-up period of the class-D amplifying circuit 10. In one embodiment, the input power AVCC is correlated with the input power PVDD; for example, the input power AVCC is equal to the input power PVDD. For another example, the input power AVCC can be electrically connected to the input power PVDD via a filtering resistor having a low resistance.

In one embodiment, the power converter circuit 50 and a part of the class-D amplifying circuit 10 (e.g., circuits excluding the first inductor L1 and the second inductor L2 or further excluding the switches Q1~Q4) as shown in FIG. 3 can be integrated as an integrated circuit (IC).

The present invention provides a class-D amplifying system as described above. The class-D amplifying system of the present invention converts the output signals of the class-D amplifying circuit to the DC power supply AVDD by a power converter circuit. Because the power stages of the class-D amplifying circuit are switching regulators, the present invention can improve efficiency and reduce power consumption under light-load condition, and the present invention does not require extra external devices.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A class-D amplifying system, comprising:
   a class-D amplifier circuit, which is configured to operably convert an input signal to a switch control signal in pulse width modulation fashion, wherein the switch control signal is configured to operably control a plurality of switches, so as to operate a first inductor and a second inductor to convert an input power to respectively generate a positive output signal and a negative output signal which are complementary to each other, to thereby drive a load; and
   a power converter circuit, which is configured to operably select at least one of the positive output signal and the negative output signal as an intermediate power supply and to operably convert the intermediate power supply into a DC power supply to serve as at least a portion of power of the class-D amplifier circuit.

2. The class-D amplifying system of claim 1, wherein the power converter circuit includes:
   an input selection circuit, which is configured to operably select one of the positive output signal and the negative output signal as the intermediate power supply according to a level of the positive output signal and a level of the negative output signal.

3. The class-D amplifying system of claim 2, wherein the input selection circuit is configured to operably select one of the positive output signal and the negative output signal which has a higher voltage level as the intermediate power supply.

4. The class-D amplifying system of claim 3, wherein the input selection circuit includes:
   a first diode and a second diode, which are coupled back-to-back in series between the positive output signal and the negative output signal, wherein a current outflow end of the first diode and a current outflow end of the second diode are both coupled to the intermediate power supply, so that the first diode and the second diode are configured to operably conduct one of the positive output signal and the negative output signal which has a higher voltage level to the intermediate power supply.

5. The class-D amplifying system of claim 3, wherein the input selection circuit includes:
   a first switch and a second switch, which are coupled in series between the positive output signal and the negative output signal; and
   a comparison control circuit, which is configured to operably compare the positive output signal with the negative output signal, so as to generate a selection signal for controlling the first switch and the second switch, to conduct one of the positive output signal and the negative output signal which has a higher voltage level to the intermediate power supply.

6. The class-D amplifying system of claim 3, wherein in a case when the input signal is zero level, the voltage level of the intermediate power supply is a common mode level of the positive output signal and the negative output signal.

7. The class-D amplifying system of claim 6, wherein the common mode voltage is ½ of the voltage of the input power.

8. The class-D amplifying system of claim 3, wherein the voltage level of the intermediate power supply is a sum of ½ of the amplitude of a difference mode voltage plus a common mode voltage, wherein the difference mode voltage is a difference between the positive output signal and the negative output signal, and the common mode voltage is a common mode level of the positive output signal and the negative output signal.

9. The class-D amplifying system of claim 2, wherein the power converter circuit further includes:
   a first low drop-out linear regulator (LDO), which is configured to operably convert the intermediate power supply into the DC power supply.

10. The class-D amplifying system of claim 9, wherein the power converter circuit further includes:
    a second low drop-out linear regulator (LDO), which is configured to operably convert the input power into the DC power supply in a case when a voltage level of the intermediate power supply is lower than a threshold.

11. The class-D amplifying system of claim 1, wherein the first inductor and a portion of the plurality of switches constitute a positive sub-power stage, whereas, the second inductor and another portion of the plurality of switches constitute a negative sub-power stage, wherein both the positive sub-power stage and the negative sub-power stage are buck power stage circuits, boost power stage circuits or buck-boost power stage circuits.

12. The class-D amplifying system of claim 1, wherein the class-D amplifier circuit includes:
    a signal processing circuit, configured to generate the switch control signal based on the input signal; and
    a driving circuit, configured to buffer the switch control signal to generate a driving signal for driving the plurality of switches;
    wherein the DC power supply is configured to supply power to the signal processing circuit and/or the driving circuit.

13. A power converter circuit, which is configured to operably supply power to a class-D amplifier circuit, wherein the class-D amplifier circuit is configured to operably convert an input signal to a switch control signal in pulse width modulation fashion, wherein the switch control signal is configured to operably control a plurality of switches, so as to operate a first inductor and a second inductor to convert an input power to respectively generate a positive output signal and a negative output signal which are complementary to each other, to thereby drive a load; the power converter circuit comprising:
    an input selection circuit, which is configured to operably select one of the positive output signal and the negative output signal as an intermediate power supply according to a level of the positive output signal and a level of the negative output signal; and
    a first low drop-out linear regulator (LDO), which is configured to operably convert the intermediate power supply into a DC power supply to serve as at least a portion of power of the class-D amplifier circuit.

14. The power converter circuit of claim 13, wherein the input selection circuit is configured to operably select one of the positive output signal and the negative output signal which has a higher voltage level as the intermediate power supply.

15. The power converter circuit of claim 14, wherein the input selection circuit includes:
    a first diode and a second diode, which are coupled back-to-back in series between the positive output signal and the negative output signal, wherein a current outflow end of the first diode and a current outflow end of the second diode are both coupled to the intermediate power supply, so that the first diode and the second diode are configured to operably conduct one of the positive output signal and the negative output signal which has a higher voltage level to the intermediate power supply.

16. The power converter circuit of claim 14, wherein the input selection circuit includes:
    a first switch and a second switch, which are coupled in series between the positive output signal and the negative output signal; and
    a comparison control circuit, which is configured to operably compare the positive output signal with the negative output signal, so as to generate a selection signal for controlling the first switch and the second switch, to conduct one of the positive output signal and the negative output signal which has a higher voltage level to the intermediate power supply.

17. The power converter circuit of claim 14, wherein in a case when the input signal is zero level, the voltage level of the intermediate power supply is a common mode level of the positive output signal and the negative output signal.

18. The power converter circuit of claim 17, wherein the common mode voltage is ½ of the voltage of the input power.

19. The power converter circuit of claim 14, wherein the voltage level of the intermediate power supply is a sum of ½ of the amplitude of a difference mode voltage plus a common mode voltage, wherein the difference mode voltage is a difference between the positive output signal and the negative output signal, and the common mode voltage is a common mode level of the positive output signal and the negative output signal.

20. The power converter circuit of claim 13, wherein the power converter circuit further includes:
    a second low drop-out linear regulator (LDO), which is configured to operably convert the input power into the DC power supply in a case when a voltage level of the intermediate power supply is lower than a threshold.

21. The power converter circuit of claim 13, wherein the first inductor and a portion of the plurality of switches constitute a positive sub-power stage, whereas, the second inductor and another portion of the plurality of switches constitute a negative sub-power stage, wherein both the positive sub-power stage and the negative sub-power stage are buck power stage circuits, boost power stage circuits or buck-boost power stage circuits.

22. The power converter circuit of claim 13, wherein the class-D amplifier circuit includes:
    a signal processing circuit, configured to generate the switch control signal based on the input signal; and
    a driving circuit, configured to buffer the switch control signal to generate a driving signal for driving the plurality of switches;
    wherein the DC power supply is configured to supply power to the signal processing circuit and/or the driving circuit.

* * * * *